United States Patent
Tanaka et al.

(10) Patent No.: US 8,026,459 B2
(45) Date of Patent: Sep. 27, 2011

(54) LASER SURFACE TREATMENT

(75) Inventors: Kenichiro Tanaka, Neyagawa (JP); Masayuki Fujita, Ikeda (JP)

(73) Assignees: Institute for Laser Technology, Osaka (JP); Panasonic Electric Works Co., Ltd., Osaka (JP)

(*) Notice: Subject to any disclaimer, the term of this patent is extended or adjusted under 35 U.S.C. 154(b) by 893 days.

(21) Appl. No.: 11/388,973

(22) Filed: Mar. 27, 2006

(65) Prior Publication Data

US 2006/0213880 A1 Sep. 28, 2006

(30) Foreign Application Priority Data

Mar. 28, 2005 (JP) ................................. 2005-093145

(51) Int. Cl.
*B23K 26/00* (2006.01)
(52) U.S. Cl. ............................ 219/121.69; 219/121.68
(58) Field of Classification Search ............. 219/121.69, 219/121.68, 121.67; 85/130, 131
See application file for complete search history.

(56) References Cited

U.S. PATENT DOCUMENTS

| | | | | | |
|---|---|---|---|---|---|
| 5,072,091 | A | * | 12/1991 | Nagata et al. | 219/121.68 |
| 5,417,896 | A | * | 5/1995 | Fischer et al. | 264/400 |
| 5,558,789 | A | | 9/1996 | Singh | |
| 5,910,256 | A | * | 6/1999 | Tsunetomo et al. | 216/24 |
| 6,291,797 | B1 | * | 9/2001 | Koyama et al. | 219/121.73 |
| 6,555,781 | B2 | * | 4/2003 | Ngoi et al. | 219/121.67 |
| 6,657,155 | B2 | | 12/2003 | Abe et al. | |
| 6,682,688 | B1 | | 1/2004 | Higashi et al. | |
| 2002/0097962 | A1 | * | 7/2002 | Yoshimura et al. | 385/50 |
| 2003/0185697 | A1 | | 10/2003 | Abe et al. | |
| 2004/0013805 | A1 | * | 1/2004 | Nagata et al. | 427/331 |
| 2004/0149705 | A1 | * | 8/2004 | Yamada et al. | 219/121.69 |
| 2004/0182201 | A1 | | 9/2004 | Fuwa et al. | |
| 2004/0228754 | A1 | | 11/2004 | Abe et al. | |
| 2005/0029711 | A1 | | 2/2005 | Abe et al. | |
| 2006/0138102 | A1 | * | 6/2006 | Sawada et al. | 219/121.69 |

FOREIGN PATENT DOCUMENTS

| | | | |
|---|---|---|---|
| JP | 06198466 A | * | 7/1994 |
| JP | 06212451 | * | 8/1994 |
| JP | 06212451 A | * | 8/1994 |
| JP | 2002-372641 | | 12/2002 |
| JP | 2003-057422 | | 2/2003 |
| JP | 2003-133690 | | 5/2003 |
| JP | 2004-339538 | | 12/2004 |
| JP | 2004-354535 | | 12/2004 |
| JP | 2004-360012 | | 12/2004 |
| WO | 00/30166 | | 5/2000 |

OTHER PUBLICATIONS

Choi et al., "Formation of Nano-Pattern on Metal Using Femtosecond Laser Pulses" *Hankook Kwanghak Hoeji Opt. Soc. Korea*, vol. 17, No. 2: 203-206 (2006), abstract only.

(Continued)

*Primary Examiner* — M. Alexandra Elve

(74) *Attorney, Agent, or Firm* — Greenblum & Bernstein, PLC

(57) ABSTRACT

A laser surface treatment for reducing reflection loss on the surface of an optical material is provided. A metal film is formed on the surface of the optical material, and then the metal film is removed from the optical material by irradiation of an ultra-intense short-pulse laser beam having a pulse width of 1 femtosecond to 100 picoseconds, so that a fine periodic structure is formed on the surface of the optical material exposed by the removal of the metal film. The obtained fine periodic structure has asperities with a periodic interval of preferably 50 to 1000 nm, which can be controlled by changing the laser energy density.

11 Claims, 2 Drawing Sheets

OTHER PUBLICATIONS

Blaesi et al., "Entspiegeln Mit Mottenaugenstrukturen Spritzgiessen Funktionaler Mikrostrukturierter Oberflaechen" Kunststoffe, Carl Hanser Verlag, Munchen, vol. 92, No. 5: 50-53 (2002).
English Language Abstract of JP 2004-360012.
English Language Abstract of JP 2003-057422.
Japanese Office Action dated Jul. 27, 2010 that issued with respect to Japanese Patent Application No. 2005-093145, along with a partial English language translation.

* cited by examiner

LASER SURFACE TREATMENT

BACKGROUND OF THE INVENTION

1. Field of the Invention

The present invention relates to a laser surface treatment using an ultra-intense short-pulse laser beam, and particularly for forming a fine periodic structure, which is effective to reduce reflection loss on the surface of an optical material.

2. Disclosure of the Prior Art

As a technique of forming a fine periodic structure on a surface of transparent substrate by use of a laser beam, for example, Japanese Patent Early Publication [KOKAI] 2003-57422 discloses a method of forming a periodic microstructure by irradiation of femtosecond-pulse laser beams. This method is essential to use two femtosecond-pulse laser beams interfered with each other, which are irradiated to a substrate to form a hologram diffraction grating on the substrate. The obtained diffraction grating has a periodic structure with a minimum average size of 5 to 200 nm. In this case, however, there is an inconvenience that the positional adjustment of an optical system must be performed with high accuracy such that the two femtosecond-pulse laser beams are interfered to each other. In addition, there is a problem that a large area treatment is difficult because of using the interference phenomenon.

By the way, when light propagating in an optical medium having a refraction index is incident on another optical medium having a different refraction index, reflection loss is generally caused at the interface between these optical mediums. The reflection loss increases as a difference of refraction index between the optical mediums becomes larger. In addition, under the condition that the light is incident on the optical medium having a small refraction index from another optical medium having a large refraction index, when the incident angle exceeds a threshold value (total reflection angle), total reflection occurs, so that the light can not propagate into the optical medium having the small refraction index. For example, under the condition that the light propagates from sapphire having the refraction index of 7.7 to the air having the refraction index of 1, when the incident angle is at right angle, the reflection loss is 7.7%. On the other hand, when the incident angle exceeds 34.4 degrees, the total reflection occurs. Thus, it is a subject to be solved to reduce the reflection loss in optical members using the optical transparency.

SUMMARY OF THE INVENTION

Therefore, a primary concern of the present invention is to provide a laser surface treatment for forming a fine periodic structure that is effective to reduce the reflection loss on the surface of an optical material by use of a reduced laser power without using the interference phenomenon of laser beams.

That is, the laser surface treatment of the present invention comprises the steps of forming a metal film on a surface of a substrate having optical transparency; and removing said metal film from the substrate by irradiation of an ultra-intense short-pulse laser beam having a pulse width of 1 femtosecond (fs) to 100 picoseconds (ps), so that a fine periodic structure having a periodic interval of 50 to 1000 nm is formed on the surface of the substrate exposed by the removal of the metal film.

According to this laser surface treatment, the fine periodic structure having the capability of reducing the reflection loss can be obtained on the surface of the substrate by forming the metal film at a required area on the substrate, and then removing the metal film from the substrate by use of the ultra-intense short-pulse laser beam. In addition, since the periodic interval of the fine periodic structure can be controlled by changing the laser energy density, it is possible to easily produce an optical member having the fine periodic structure, which is suitable to the wavelength of a light to be incident thereon. Furthermore, there is an advantage that the laser surface treatment can be performed by use of a laser energy density sufficiently smaller than the case of treating the substrate by the laser irradiation in the absence of the metal film. In addition, since the ultra-intense short-pulse laser beam is used in the present invention, the occurrence of thermal damage to the substrate surface can be avoided.

In the laser surface treatment of the present invention, when a circularly- or elliptically-polarized laser beam is used as the ultra-intense short-pulse laser beam, the fine periodic structure is characterized by having dot-like projections formed in the periodic interval. On the other hand, when a linearly-polarized laser beam is used as the ultra-intense short-pulse laser beam, the fine periodic structure is characterized by having elongate projections extending in a direction perpendicular to the polarization direction and formed in the periodic interval. In the present invention, the periodic interval can be defined as an average horizontal distance between tops of adjacent projections (adjacent dot-like projections or elongate projections) of the fine periodic structure.

In the above-described laser surface treatment, it is preferred that the metal film is made of at least one selected from the group of copper, iron, gold, silver, aluminum, nickel, magnesium, titanium, silicon, stainless steels and alloys thereof, and more preferably from copper, iron and an alloy containing at least one of copper and iron.

In addition, it is preferred that a laser energy density of the ultra-intense short-pulse laser beam is in a range of 1 to 100 mJ/mm$^2$. By adequately selecting the laser energy density in this range, the fine periodic structure having a desired periodic interval can be stably formed. In addition, the periodic interval may be controlled by changing the irradiation angle of the ultra-intense short-pulse laser beam to the metal film.

A further concern of the present invention is to provide an optical member having the fine periodic structure formed by the laser surface treatment described above. This optical member of the present invention brings about a reduction in reflection loss, and an improvement in transmission factor.

These and additional features of the present invention and advantages brought thereby will become more apparent from the following detail description of the invention.

DETAIL DESCRIPTION OF THE INVENTION

A laser surface treatment of the present invention is explained below in detail.

A first step of the laser surface treatment of the present invention is a metal-film formation step. That is, a metal film is formed on a surface of a substrate having optical transparency. As the substrate material, for example, it is possible to use an inorganic material having transparency, and preferably fused silica, a nonsilica glass (comprising $ZrF_4$-based glass, $ThF_4$-based glass, $BeF_2$-based glass, $CaF_2$-based glass and oxide glass), sapphire glass, ZnO-based glass, SiC-based glass, GaN-based glass (comprising InGaN and AlInGaN), InN-based glass, YGA-based glass, GaAs-based glass, GaP-based glass, ZnS-based glass, ZnSe-based glass, SrS-based glass or $CaGa_2S_4$-based glass.

As a material of the metal film, for example, it is preferred to use at least one selected from the group of copper, iron, gold, silver, aluminum, nickel, magnesium, titanium, silicon, stainless steels and alloys thereof. In this case, a fine periodic structure described later can be obtained on the substrate with stability of quality. In addition, from the viewpoint of good workability of the metal film, it is preferred to use copper, iron or an alloy containing at least one of copper and iron. Moreover, from the viewpoint of effectively generating surface plasmon polaritons described later, it is preferred to use gold, silver or copper. A method of forming the metal film on the substrate is not limited. To uniformly form the metal film on the substrate, for example, it is preferred use sputtering, physical vapor deposition (PVD) or vacuum deposition.

Figure 1:
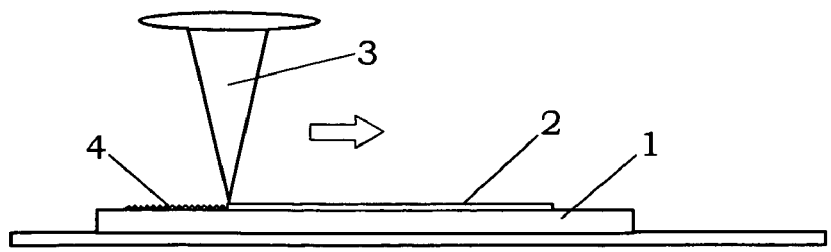
FIG. 1 is a schematic diagram of a laser surface treatment of the present invention.

A second step of the laser surface treatment of the present invention is a laser irradiation step. That is, as shown in FIG. 1, the metal film 2 is removed from the substrate 1 by irradiation of an ultra-intense short-pulse laser beam 3 having a pulse width of 1 femtosecond (fs) to 100 picoseconds (ps), and preferably 1 fs to 1 ps, so that the fine periodic structure 4 having a periodic interval of 50 to 1000 nm is formed on the surface of the substrate exposed by the removal of the metal film. If necessary, the laser beam can be scanned to efficiently form the fine periodic structure on the substrate having a larger surface area to be treated. In place of scanning the laser beam, a table carrying the substrate may be traveled to obtain the same effect.

Figures 2A, 2B:
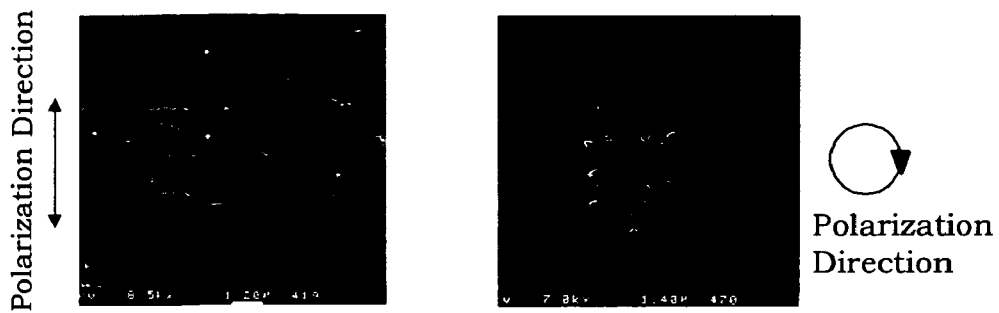
FIG. 2A is a SEM photograph showing a fine periodic structure obtained by irradiation of a linearly-polarized laser beam.
FIG. 2B is a SEM photograph showing the fine periodic structure obtained by irradiation of a circularly-polarized laser beam.
Figure 2C:
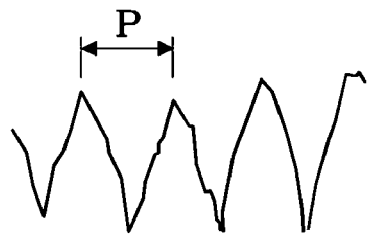
FIG. 2C shows a surface profile of the fine periodic structure.
Figure 3:
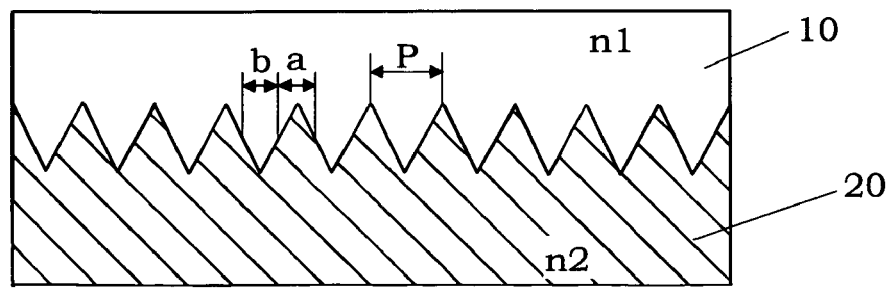
FIG. 3 is a schematic cross-sectional view of an interface between two kinds of optical substrates each having the fine periodic structure.

As the ultra-intense short-pulse laser beam, for example, it is possible to use a mode-locked. Ti: Sapphire laser, YAG laser, SHG-Ti Sapphire laser, THG-Ti Sapphire laser, FHG-Ti Sapphire laser, SHG-YAG laser, THG-YAG laser, FHG-YAG laser, or excimer laser. When the ultra-intense short-pulse laser beam is provided by a linearly-polarized laser beam, the fine periodic structure having elongate projections extending in a direction perpendicular to the polarization direction and formed at the periodic interval is obtained on the substrate, as shown in FIG. 2A. On the other hand, when the ultra-intense short-pulse laser beam is provided by a circularly- or elliptically-polarized laser beam, the fine periodic structure having dot-like projections formed at the periodic interval is obtained on the substrate, as shown in FIG. 2B. Thus, the fine periodic structure can be controlled by changing the polarization direction of the laser beam. In FIG. 2C showing a surface profile of the fine periodic structure, "P" designates the periodic interval, which is defined as an average horizontal distance between tops of adjacent projections of the fine periodic structure.

It is preferred that the laser irradiation step is performed under a reduced pressure of 0.01 Pa or less to prevent a situation that a part of the metal film vaporized by the laser irradiation is deposited on the substrate surface. Alternatively, the laser irradiation step may be performed in an inert gas atmosphere to prevent deterioration such as oxidation of the substrate.

By the way, the present invention has been achieved based on the inventor's discovery that the fine periodic structure can be formed on the substrate surface exposed by removing the metal film with the specific laser irradiation. Although the present invention is not limited by a mechanism for forming the fine periodic structure, it is believed that the following phenomenon is caused by the laser irradiation. That is, when the metal film is removed from the substrate by the laser irradiation, surface plasmon polaritons are generated at a part of the metal film left on the substrate, so that a locally enhanced electric field developed in the vicinity of the substrate surface contributes to the formation of the fine periodic structure on the substrate.

In general, when a substrate is worked by the laser irradiation without the formation of the metal film thereon, the laser beam needs to have a laser energy density equal to or greater than a threshold energy density (e.g., about 50 $mJ/mm^2$ in the case of using fused silica as the substrate). In other words, when the laser energy density is smaller than the threshold energy density, the substrate cannot be worked by the laser irradiation. However, in the laser surface treatment of the present invention performed in the presence of the metal film, since the surface plasmon polaritons described above enhance the formation of the fine periodic structure, the laser energy density needed in the laser surface treatment can be remarkably reduced (e.g., ⅓ of the threshold energy density), as compared with the case of performing the laser surface treatment without the formation of the metal film.

In addition, since no interference phenomenon of two laser beams is needed in the laser surface treatment of the present invention, it is possible to easily and efficiently perform the laser surface treatment to a large area of the substrate. In addition, when the ultra-intense short-pulse laser beam is used, the laser surface treatment can be finished in a short time period, thereby achieving advantages of preventing the occurrence of thermal damage to the substrate, and improving the stability of quality of the fine periodic structure.

As described above, the technical concept of the present invention is characterized by forming the fine periodic structure on the substrate by the help of the surface plasmon polariton effect. Therefore, the present invention is different from the conventional technique of forming a wiring pattern of the metal film on the substrate by use of a laser beam. From this viewpoint, the laser surface treatment of the present invention can be defined by comprising the steps of forming the metal film on a predetermined region of the substrate, and then removing all of the metal film on the predetermined region by irradiation of the ultra-intense short-pulse laser beam, so that the fine periodic structure is formed on the predetermined region of the substrate exposed by the removal of the metal film.

Next, the fine periodic structure of the present invention is explained in detail. It is preferred that the periodic interval of the fine periodic structure is determined within a range of 1/10 times to 10 times of the wavelength of a light to be propagated into the substrate. That is, when the periodic interval is in the range of from the wavelength (λ) to 10 times of the wavelength (λ), the fine periodic structure acts as a diffraction grating, so that even when the light is incident on the substrate at an incident angle larger than a threshold angle causing total reflection, the light is allowed to propagate into the substrate by the diffraction effect. In addition, when the periodic interval is in the range of from 1/10 times of the wavelength (λ) to the wavelength (λ), the fine periodic structure acts as if the refraction index gradually decreased. As a result, since a considerable change in refraction index does not occur at the substrate surface, the reflection can be prevented to improve the transmission factor.

For example, when a light is incident on a first material 10 having a refraction index "n1" from a second material 20 having a different refraction index "n2" through the fine periodic structure formed at the interface between the first and second materials, and the periodic interval "P" of the fine periodic structure is sufficiently smaller than the wavelength "λ" of the light, effective refractive indexes ($n_E$, $n_M$) for TE and TM waves are represented by the following equations:

$$\langle n_E \rangle = \sqrt{\frac{a \cdot n_1^2 + b \cdot n_2^2}{a+b}} \quad (1)$$

$$\langle n_M \rangle = \sqrt{\frac{a+b}{a/n_1^2 + b/n_2^2}} \quad (2)$$

wherein "a" is a half width of the triangular projection of the fine periodic structure of the second material 20, and "b" is a half width of the triangular projection of the fine periodic structure of the first material 10. Thus, since the effective refractive indexes gradually change, the interface formed by these fine periodic structures functions as a thin layer having an intermediate refractive index between the refractive indexes of the first and second materials (10, 20). As a result, it is possible to effectively reduce the reflection.

In the present invention, it is preferred that a laser energy density of the ultra-intense short-pulse laser beam is in a range of 1 to 100 mJ/mm². Since the periodic interval of the fine periodic structure is gradually changed with increasing the laser energy density, there is an advantage that the fine periodic structure with a desired periodic interval can be easily formed by controlling the laser energy density in this range.

Figure 4:
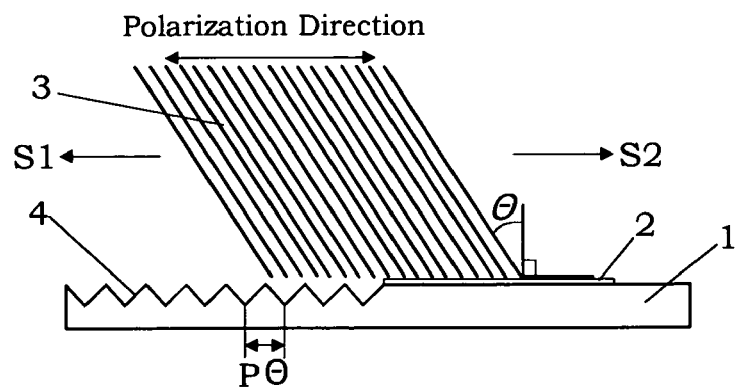
FIG. 4 is a schematic diagram showing a relation between laser irradiation angle and the periodic interval of the fine periodic structure.

In the present invention, the periodic interval of the fine periodic structure can be also controlled by changing the irradiation angle of the ultra-intense short-pulse laser beam to the metal film. That is, as shown in FIG. 4, on the condition that the polarization direction of the laser beam is in agreement with the laser scanning direction, and the laser beam 3 is irradiated to the metal film 2 at an irradiation angle "Θ" that is not 90 degrees, when the laser beam 3 is scanned in the direction "S1", the periodic interval (PΘ) of the fine periodic structure 4 can be determined by the following equation (3), and when the laser beam 3 is scanned in the direction "S2", the periodic interval (PΘ) can be determined by the following equation (4). In these equations, "P0" is the periodic interval of the fine periodic structure obtained by the laser irradiation from the direction vertical to the metal film.

$$P\eta = P0/(1+\sin\Theta) \quad (3)$$

$$P\Theta = P0/(1-\sin\Theta) \quad (4)$$

In addition, there is a tendency that a thickness of the metal film give an influence on the periodic interval of the fine periodic structure. That is, in the case of using a higher laser energy density, as the thickness of the metal film becomes larger, there is the tendency that the periodic interval increases. In the present invention, it is preferred that the metal film has a thickness of 50 nm to 1000 nm. Therefore, there is a potential that the periodic interval can be easily controlled by selecting an appropriate thickness of the metal film in this range.

In the present invention, it is preferred to perform an etching treatment to the treated surface of the substrate after the laser irradiation. As the etching treatment, plasma etching or chemical etching is available. In the chemical etching, hydrofluoric acid is preferably used to selectively remove residues from the treated surface of the surface. As an example, the etching treatment can be performed for 5 minutes or more by use of a 5% hydrofluoric acid aqueous solution. By this etching treatment, the light can be more efficiently propagated into the substrate through the fine periodic structure.

After the laser irradiation, it is also preferred to bond the fine periodic structure formed on a first substrate with a second substrate having a different refraction index. In this case, the first substrate with the fine periodic structure has a larger hardness than the second substrate. Therefore, the fine periodic structure can be tightly fitted to the surface of the second substrate having a soft hardness to form the fine periodic structure with high quality at the interface between the first and second substrates, while preventing the occurrence of pores.

Figure 5:
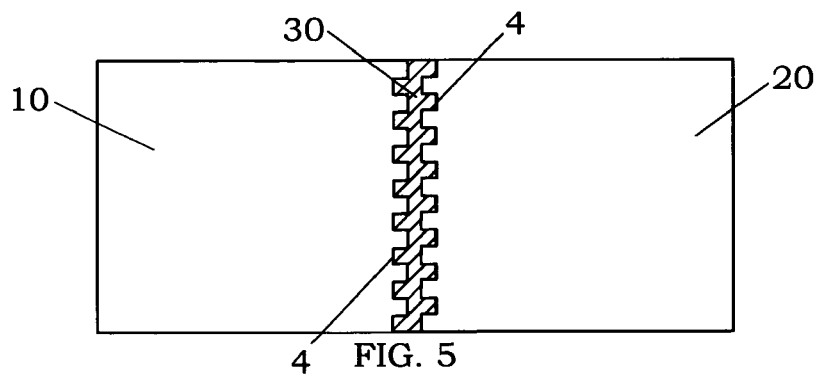
FIG. 5 is a schematic cross-sectional view of an optical member of the present invention.
Figure 6A:
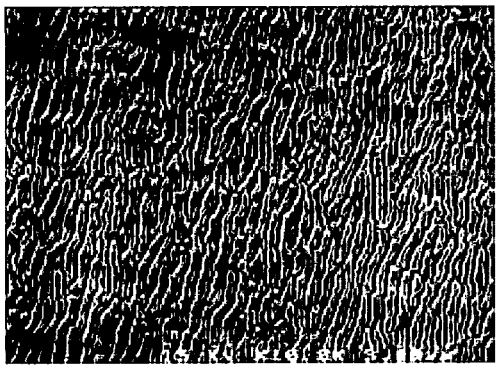
FIGS. 6A to 6D are SEM photographs of fine periodic structures respectively obtained in Examples 3, 6, 9 and 12.
Figure 6B:
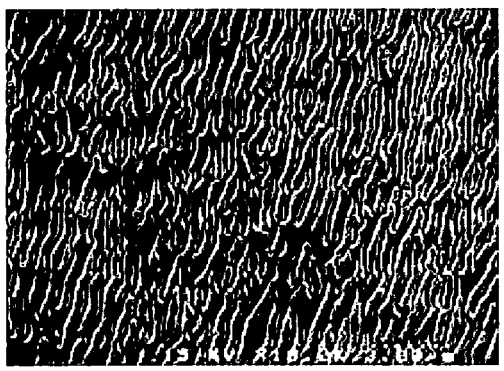
Figure 6C:
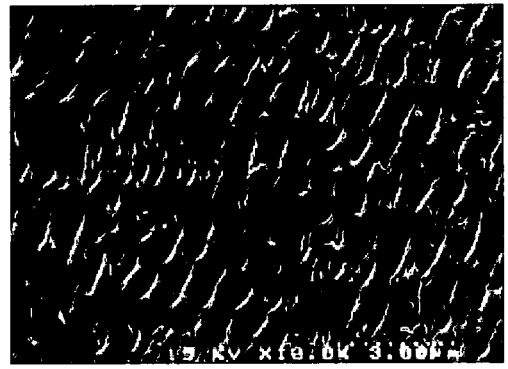
Figure 6D:
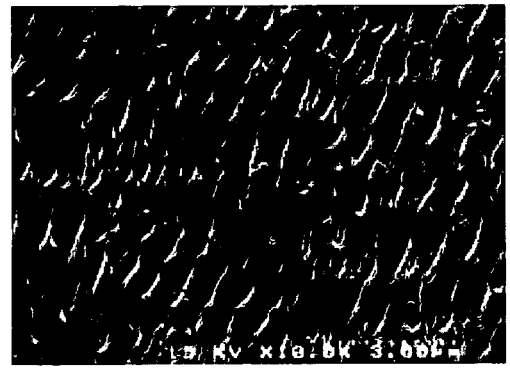

Alternatively, it is further preferred that the fine periodic structure formed on a first substrate is bonded with the fine periodic structure formed on a second substrate through an intermediate layer having a different refraction index from the first and second substrates. In this case, since the material used to form the intermediate layer has a hardness smaller than the first and second substrates, it can be tightly filled to the fine periodic structures of these substrates. Therefore, it is possible to obtain an optical member having a pore free interface between the first and second substrates. For example, as shown in FIG. 5, when the first substrate 10 is sapphire having the refractive index of 1.77, and the second substrate 20 is fused silica having the refractive index of 1.5, the intermediate layer 30 can be preferably formed by use of an acrylic resin having the refractive index of 1.6 to obtain the optical member having a gradient of the refractive index therein, by which the reflection loss of light can be effectively prevented. In addition, an increase in surface area at the interface between the adjacent optical substrates brought by the formation of the fine periodic structure achieves an improvement in transmission factor. The fine periodic structure may be formed on only one of the first and second substrates.

EXAMPLES 1 to 12

In each of Examples 1 to 12, the following laser surface treatment was performed. That is, a sapphire single crystal was used as the substrate. A copper film was formed on the substrate by a conventional sputtering method to have the thickness listed in Table 1. Then, as shown in FIG. 1, the copper film was removed from the substrate by irradiation of an ultra-intense short-pulse laser beam having a pulse width of 100 fs under a reduced pressure of 0.01 Pa with the laser energy density listed in Table 1. A periodic interval of a resultant fine periodic structure was measured by using scanning electron microscope (SEM). Results are shown in Table 1. In addition, SEM photographs of the fine periodic structures formed in Examples 3, 6, 9 and 12 are shown in FIGS. 6A to 6D. The laser beam used in these Examples is a linearly-polarized laser. Therefore, the fine periodic structure has fine elongate asperities extending in a direction perpendicular to the polarization direction, as shown in FIG. 2A.

TABLE 1

|  | Thickness of Metal Film (nm) | Laser Energy Density (mJ/mm$^2$) | Periodic Interval (nm) |
|---|---|---|---|
| Example 1 | 100 | 5 | 167 |
| Example 2 | 100 | 40 | 250 |
| Example 3 | 100 | 80 | 270 |
| Example 4 | 200 | 5 | 214 |
| Example 5 | 200 | 40 | 300 |
| Example 6 | 200 | 80 | 330 |
| Example 7 | 300 | 5 | 214 |
| Example 8 | 300 | 40 | 300 |
| Example 9 | 300 | 80 | 750 |
| Example 10 | 400 | 5 | 167 |
| Example 11 | 400 | 40 | 330 |
| Example 12 | 400 | 80 | 750 |

As understood from the results of Table 1, with respect to each of the four different thicknesses (100, 200, 300, 400 nm) of the copper film, as the laser energy density increases, the periodic interval becomes larger. In addition, when the thickness of the copper film is 100 nm, the influence of the laser energy density on the periodic interval is relatively small. However, when the thickness of the copper film is 300 nm or more, a remarkable change in periodic interval is caused by increasing the laser energy density. Thus, by selecting a suitable combination of the thickness of the metal film and the laser energy density, it is possible to obtain the fine periodic structure having a desired periodic interval.

EXAMPLES 13 and 14

In Examples 13, a copper film is formed on a fused silica substrate, and then the copper film is removed from the substrate by irradiation of an ultra-intense short-pulse laser beam having a pulse width of 100 fs, which is a linearly-polarized laser beam. Similarly, the fine periodic structure of Example 14 was formed on the fused silica substrate by substantially the same procedures as Example 13 except for using a circularly-polarized laser beam. In these cases, a periodic interval of a resultant fine periodic structure is approximately 200 nm.

With respect to each of Examples 13 and 14, the transmission factor of the fused silica substrate was measured by use of two lights having wavelengths of 670 nm and 450 nm. In addition, the transmission factor of the fused silica substrate without the laser surface treatment was also measured as Comparative Example 1. Results are shown in Table 2. It can be understood from the results of Table 2 that the laser surface treatment of the present invention improves the transmission factor.

TABLE 2

|  | Polarization | Transmission Rate (%) | |
|---|---|---|---|
|  |  | 450 nm | 670 nm |
| Example 13 | Linear polarization | 94.0 | 96.2 |
| Example 14 | Circular polarization | 95.7 | 96.2 |
| Comp. Example 1 | No treatment | 93.3 | 93.7 |

What is claimed is:

1. A process of developing a periodic structure in a surface of an optical transparent substrate, said process comprising the steps of:

forming a metal film having a thickness of 50 nm to 1000 nm on a surface of said optical transparent substrate made of non-metal material; and irradiating an ultra-intense short-pulse laser beam having a pulse width of 1 femtosecond (fs) to 100 picoseconds (ps) to said metal film in order to ablate a portion of said metal film to generate within an ablated portion of said metal film, a resulting metal plasma, which interacts with said laser beam for etching the surface of said substrate, leaving a fine periodic structure having a periodic interval of 50 nm to 1000 nm in the surface thereof.

2. The process of developing a periodic structure in a surface of an optical transparent substrate as set forth in claim 1, wherein said ultra-intense short-pulse laser beam is a circularly- or elliptically-polarized laser beam.

3. The process of developing a periodic structure in a surface of an optical transparent substrate as set forth in claim 1, wherein said ultra-intense short-pulse laser beam is a linearly-polarized laser beam.

4. The process of developing a periodic structure in a surface of an optical transparent substrate as set forth in claim 1, wherein said metal film is made of at least one selected from the group of copper, iron, gold, silver, aluminum, nickel, magnesium, titanium, silicon, stainless steels and alloys thereof.

5. The process of developing a periodic structure in a surface of an optical transparent substrate as set forth in claim 1, wherein a laser energy density of said ultra-intense short-pulse laser beam is in a range of 1 to 100 mJ/mm$^2$.

6. The process of developing a periodic structure in a surface of an optical transparent substrate as set forth in claim 1, wherein said metal film is formed on a predetermined region of said substrate, and then all of said metal film on the predetermined region is removed by irradiation of said ultra-intense short-pulse laser beam, so that said fine periodic structure is formed on the predetermined region of said substrate exposed by the removal of said metal film.

7. The process of developing a periodic structure in a surface of an optical transparent substrate as set forth in claim 1, further comprising the step of changing an irradiation angle of said ultra-intense short-pulse laser beam to said metal film to control said periodic interval of said fine periodic interval.

8. The process of developing a periodic structure in a surface of an optical transparent substrate as set forth in claim 1, further comprising the step of performing an etching treatment to the surface of said substrate after the irradiation of said ultra-intense short-pulse laser beam.

9. The process of developing a periodic structure in a surface of an optical transparent substrate as set forth in claim 1, further comprising the step of bonding the fine periodic structure of said substrate with a second substrate having a different refraction index from said substrate.

10. The process of developing a periodic structure in a surface of an optical transparent substrate as set forth in claim 9, wherein the fine periodic structure of said substrate is bonded with said second substrate through an intermediate layer having a different refraction index from said substrate and said second substrate and a hardness smaller than said substrate and said second substrate.

11. The process of developing a periodic structure in a surface of an optical transparent substrate as set forth in claim 1, wherein said non-metal material is selected from a group consisting of fused-silica, $ZrF_4$-based glass, $ThF_4$-based glass, $BeF_2$-based glass, Ca $F_2$-based glass, oxide glass, sapphire glass, ZnO-based glass, SiC-based glass, GaN-based glass, InN-based glass, YGA-based glass, GaAs-based glass, GaP-based glass, ZnS-based glass, ZnSe-based glass, SrS-based glass and $CaGa_2S_4$-based glass.

* * * * *